(12) United States Patent
Woo

(10) Patent No.: US 8,105,946 B1
(45) Date of Patent: Jan. 31, 2012

(54) METHOD OF FORMING CONDUCTIVE LINES OF SEMICONDUCTOR MEMORY DEVICE

(75) Inventor: Won Sic Woo, Guri-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/972,108

(22) Filed: Dec. 17, 2010

(30) Foreign Application Priority Data

Jul. 7, 2010 (KR) .................. 10-2010-0065351

(51) Int. Cl.
*H01L 21/225* (2006.01)
(52) U.S. Cl. ........ 438/682; 438/647; 438/630; 438/651; 438/581; 438/583; 257/316; 257/E21.438; 257/381; 257/413; 257/E29.3
(58) Field of Classification Search .......... 438/97, 438/488–491, 581, 583, 630, 647, 651, 682, 438/684; 257/381–390, 413, 455–456, 576, 257/754–757, E21.438, E21.439, 314–316, 257/321, E27.103, E29.3
See application file for complete search history.

(56) References Cited

U.S. PATENT DOCUMENTS

2011/0070706 A1* 3/2011 Kim et al. .................. 438/258

FOREIGN PATENT DOCUMENTS

| KR | 2002-000594 | * | 1/2002 |
| KR | 10-2003-00540 18 | | 7/2003 |
| KR | 10-2005-00695 67 | | 7/2005 |
| KR | 10-2006-0005643 | | 1/2006 |

* cited by examiner

*Primary Examiner* — Hsien Ming Lee
*Assistant Examiner* — Walter H Swanson
(74) *Attorney, Agent, or Firm* — Marshall, Gerstein & Borun LLP

(57) ABSTRACT

A method of forming the conductive lines of a semiconductor memory device comprises forming a first polysilicon layer over an underlying layer, forming first polysilicon patterns by patterning the first polysilicon layer, filling the space between the first polysilicon patterns with an insulating layer, etching a top portion of the first polysilicon patterns to form recess regions, forming spacers on the sidewalls of the recess regions, filling the recess regions with a second polysilicon layer to form second polysilicon patterns, and performing a metal silicidation process to convert the second polysilicon patterns to metal silicide patterns.

15 Claims, 5 Drawing Sheets

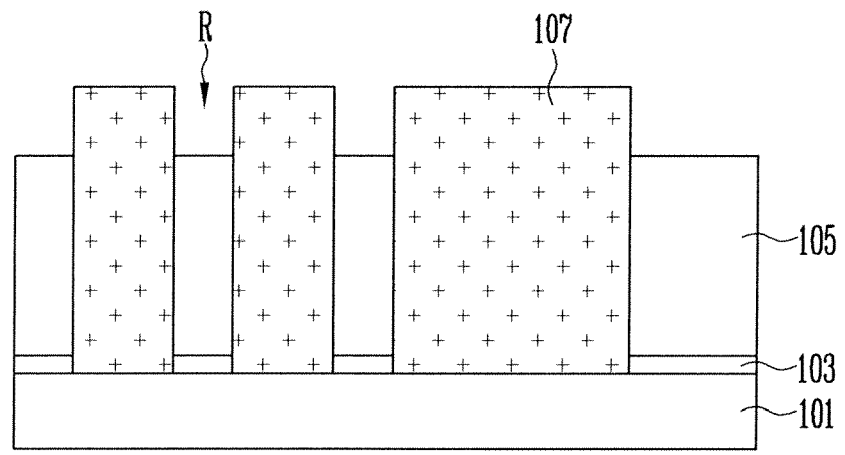
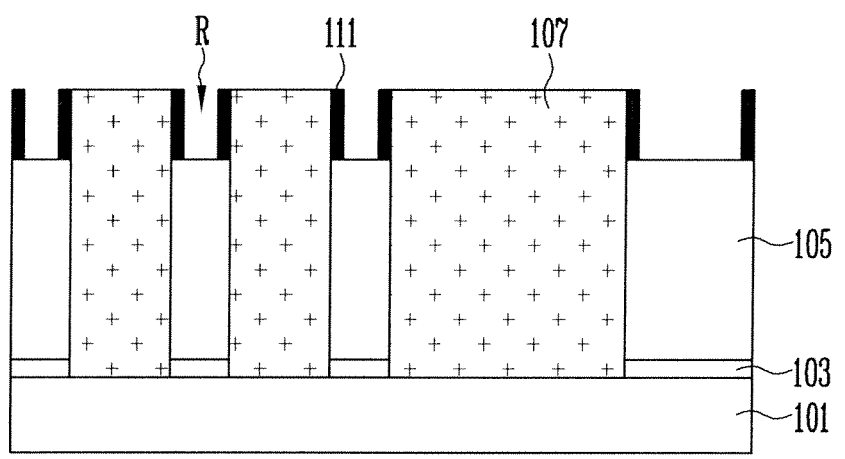
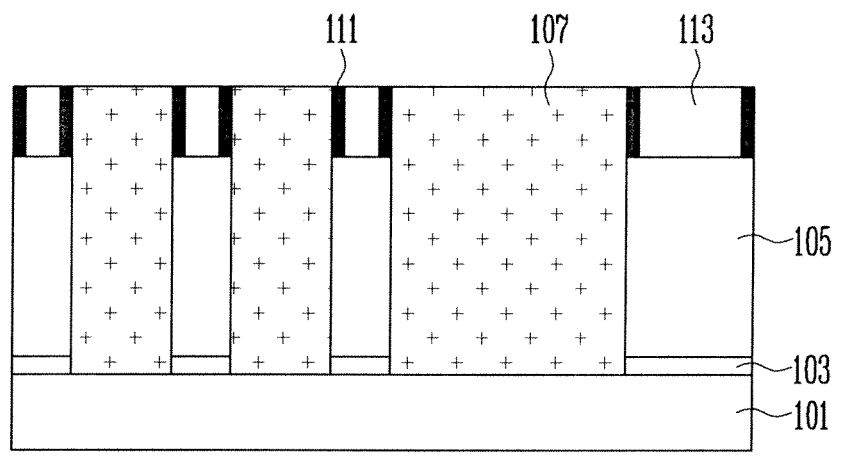

METHOD OF FORMING CONDUCTIVE LINES OF SEMICONDUCTOR MEMORY DEVICE

CROSS-REFERENCE TO RELATED APPLICATION

Priority to Korean patent application number 10-2010-0065351 filed on Jul. 7, 2010, the entire disclosure of which is incorporated by reference herein, is claimed.

BACKGROUND

Exemplary embodiments of the disclosure relate generally to a method of forming the conductive lines of a semiconductor memory device and, more particularly, to a method of forming the conductive lines of a semiconductor memory device using a metal silicide layer to improve the resistance of the conductive lines.

To lower the sheet resistance and the contact resistance of a semiconductor memory device, a metal silicide layer is used as a material for the conductive lines of the semiconductor memory device. Where the conductive lines of the semiconductor memory device are formed using the metal silicide layer, there is a problem in that a bridge phenomenon is generated in which the conductive lines are electrically coupled together.

FIGS. 1A and 1B are cross-sectional views showing a conventional method of forming conductive lines of a semiconductor memory device. In particular, FIGS. 1A and 1B show an example in which a metal silicide layer is used as the conductive lines of the semiconductor memory device.

Referring to FIG. 1A, a plurality of polysilicon patterns 15, insulated from each other with an insulating layer 17 interposed therebetween, is formed over an underlying layer 11. The polysilicon patterns 15 can be patterns that are used as word lines WL, a drain select line DSL, and a source select line SSL of a NAND flash memory device, for example.

For example, a case in which the polysilicon patterns 15 are used as the word lines WL, the drain select line DSL, and the source select line SSL is described below. The polysilicon patterns 15 can be formed using the following method, for example. First, a gate insulating layer 13 used as a dielectric layer is formed over a semiconductor substrate in which the underlying layer 11 (i.e., an isolation layer) is formed. A polysilicon layer is formed over the gate insulating layer 13. The polysilicon layer is patterned to form the plurality of separated polysilicon patterns 15. The gate insulating layer 13 can be patterned after the polysilicon patterns 15 are formed.

For reference, only the cross section taken along the underlying layer 11 (i.e., the isolation layer) is shown in FIG. 1. Although not shown, a gate insulating layer (not shown) used as a tunnel insulating layer, a floating gate (not shown), the gate insulating layer 13 used as the dielectric layer, and the polysilicon pattern 15 can be stacked over the active regions (not shown) of the semiconductor substrate separated by the underlying layer 11 (i.e., the isolation layer).

After the polysilicon patterns 15 are formed as described above, the insulating layer 17 for insulating between the polysilicon patterns 15 is formed with a height higher than a top surface of the polysilicon patterns 15. Thus, the space between the polysilicon patterns 15 is filled with the insulating layer 17. Next, the insulating layers 17 are polished to expose the top surface of the polysilicon patterns 15.

Referring to FIG. 1B, the top surface of the polysilicon patterns 15 is made to react with metal through a silicidation process, thereby forming metal silicide patterns 19 that are self-aligned over the silicon patterns 15. The metal silicidation process is described in detail below.

First, the height of the insulating layer 17 is lowered using an etch process, such as an etch-back process, thereby exposing upper sidewalls of the polysilicon patterns 15. After a cleaning process is performed, a metal layer is formed on the exposed surface of the polysilicon patterns 15 and a surface of the insulating layer 17. Next, a capping layer can be further formed over the metal layer.

After the metal layer is formed, a primary annealing process is performed. Thus, metal from the metal layer diffuses toward the polysilicon patterns 15 and an upper portion of the polysilicon patterns 15 is changed into metal silicide. Next, the unreacted metal layer that remains intact and the capping layer are removed. Accordingly, metal silicide patterns 19 having a first resistance are self-aligned on the polysilicon patterns 15. Next, a secondary annealing process is performed to form metal silicide patterns 19 (i.e., targets) having a second resistance lower than the first resistance. Accordingly, word lines WL, a drain select line DSL, and a source select line SSL, composed of stack structures of the polysilicon patterns 15 and the metal silicide patterns 19, are formed.

In the process of forming the metal silicide patterns 19, the metal silicide pattern 19 can be wider than the polysilicon pattern 15. In this case, since an interval I between conductive lines including the metal silicide patterns 19 is narrowed, a bridge phenomenon in which neighboring conductive lines are interconnected may be generated. The phenomenon becomes worse with the interval I decreasing because the degree of integration of semiconductor memory devices is increased.

BRIEF SUMMARY

Exemplary embodiments relate to a method of forming conductive lines of a semiconductor memory device that is capable of improving (i.e., reducing or eliminating) the bridge phenomenon between the conductive lines even though a metal silicide layer is used in the conductive lines.

In accordance with an exemplary embodiment of the disclosure, a method of forming the conductive lines of a semiconductor device comprises forming a first polysilicon layer over an underlying layer, forming first polysilicon patterns by patterning the first polysilicon layer, filling the space between the first polysilicon patterns with an insulating layer, etching a top portion of the first polysilicon patterns to form recess regions, forming spacers on sidewalls of the recess regions, filling the recess regions with a second polysilicon layer to form second polysilicon patterns, and performing a silicidation process to convert the second polysilicon patterns to metal silicide patterns.

The spacers preferably comprises material that is different from material of the insulating layer. The spacers preferably comprise a nitride layer. The insulating layer preferably comprises an oxide layer.

A silicon concentration of the second polysilicon layer preferably is lower than a silicon concentration of the first polysilicon layer. Each of the second polysilicon layer and the first polysilicon layer preferably is formed using a silicon (Si) gas and a dopant gas. The amount of the silicon (Si) gas used when forming the second polysilicon layer preferably is smaller than the amount of the silicon (Si) gas used when forming the first polysilicon layer.

The silicidation process preferably comprises forming a metal layer on exposed surfaces of the second polysilicon layer, the spacers, and the insulating layer, performing a primary annealing process to diffuse metal from the metal layer into the second polysilicon layer to form a metal silicide layer having a first resistance, removing unreacted metal layer remaining intact after the primary annealing process, and performing a secondary annealing process to transform the metal silicide layer having the first resistance into a metal silicide layer having a second resistance.

Before performing the primary annealing process, a capping layer for preventing the metal layer from being oxidized preferably is formed over the metal layer. The capping layer preferably comprises TiN. The metal silicide layer having the first resistance preferably comprises nickel-rich silicide and the metal silicide layer having the second resistance preferably comprises nickel mono-silicide. A process temperature of the secondary annealing process preferably is higher than a process temperature of the primary annealing process. The metal layer preferably is a nickel layer having a thickness 0.3 times a total thickness of the first polysilicon layer and the second polysilicon layer.

The spacers preferably are removed after the recess regions are filled with the second polysilicon layer or the silicidation process is performed.

The metal silicide layer having the second resistance preferably is used as word lines, a source select line, and a drain select line of a NAND flash memory device.

BRIEF DESCRIPTION OF THE DRAWINGS

FIGS. 2A to 2G are cross-sectional views illustrating a method of forming the conductive lines of a semiconductor memory device according to a first exemplary embodiment of the disclosure.

DESCRIPTION OF EMBODIMENTS

Figure 1A:
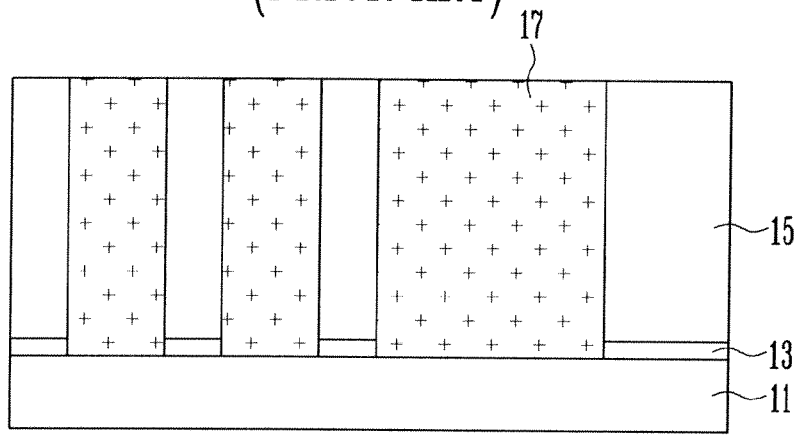
FIGS. 1A and 1B are cross-sectional views showing a conventional method of forming the conductive lines of a semiconductor memory device.
Figure 1B:
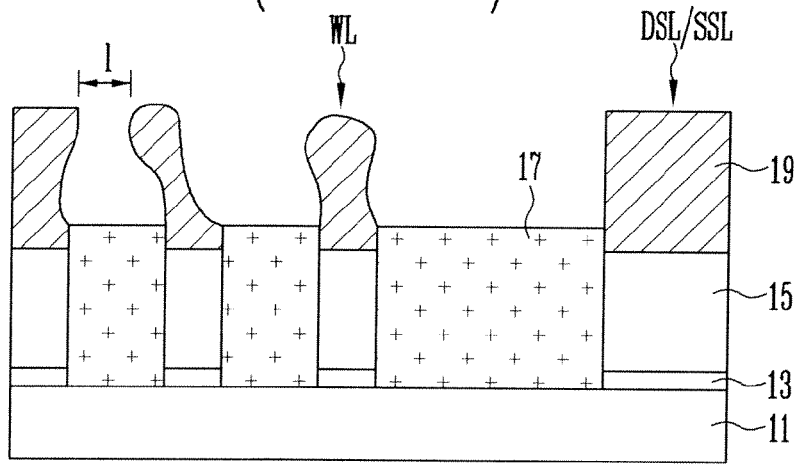

Hereinafter, exemplary embodiments of the disclosure are described in detail with reference to the accompanying drawings. The drawing figures are provided to allow those having ordinary skill in the art to understand the scope of the exemplary embodiments of the disclosure.

FIGS. 2A to 2G are cross-sectional views illustrating a method of forming the conductive lines of a semiconductor memory device according to a first exemplary embodiment of the disclosure. In particular, FIGS. 2A to 2G show the cross-sections taken along the isolation layer of a NAND flash memory device.

Figure 2A:
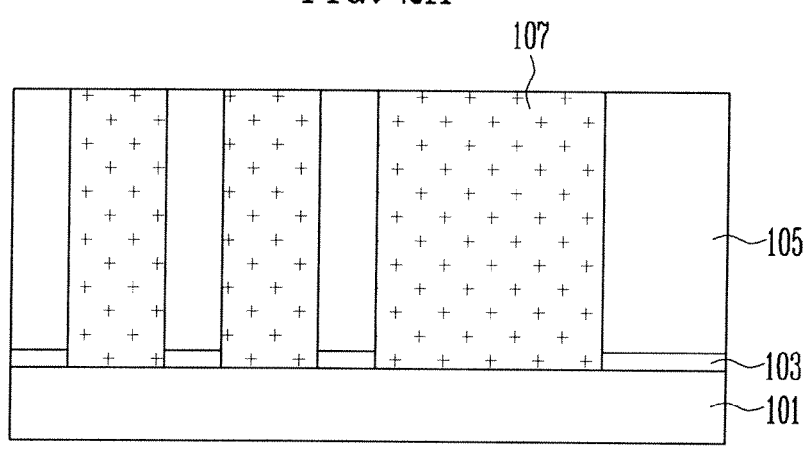

Referring to FIG. 2A, a plurality of first polysilicon patterns 105, insulated from each other with an insulating layer 107 interposed therebetween, is formed over an underlying layer 101. The underlying layer 101 illustratively is the isolation layer of a NAND flash memory device, and the first polysilicon patterns 105 illustratively are patterns used as the word lines, the drain select line, and the source select line of the NAND flash memory device.

For example, where the first polysilicon patterns 105 are patterns used as the word lines, the drain select line, and the source select line, the first polysilicon patterns 105 illustratively can be formed using the following method. First, a gate insulating layer 103 used as a dielectric layer is formed over the underlying layer 101 (i.e., the isolation layer), and a first polysilicon layer (not shown as such) is formed over the gate insulating layer 103. The first polysilicon layer is patterned to form the plurality of separated first polysilicon patterns 105. The gate insulating layer 103 can be patterned after the first polysilicon patterns 105 are formed.

Although not shown, before the gate insulating layer 103 used as the dielectric layer is formed, a gate insulating layer, used as a tunnel insulating layer, and a floating gate can be stacked over the active region of a semiconductor substrate separated by the underlying layer 101 (i.e., the isolation layer). In this case, the gate insulating layer 103, used as the dielectric layer, and the first polysilicon pattern 105, used as a control gate over the active region of the semiconductor substrate are formed over the floating gate.

After forming the first polysilicon patterns 105, an insulating layer 107 for insulating between the first polysilicon patterns 105 is formed preferably with a height higher than a top surface of the first polysilicon patterns 105. Accordingly, the space between the first polysilicon patterns 105 is filled with the insulating layer 107. Next, the insulating layer 107 is polished to expose the top surface of the polysilicon patterns 105. The polishing of the insulating layer 107 preferably is performed using a Chemical Mechanical Polishing (CMP) method, and the insulating layer 107 preferably comprises an oxide layer.

Referring to FIG. 2B, the exposed top surface of the first polysilicon patterns 105 is etched using an etch process, such as an etch-back process, so that the height of a top surface of the first polysilicon patterns 105 is lower than a top surface of the insulating layer 107. Thus, a recess region R is formed, and part of sidewalls of the insulating layers 107 is exposed. Here, an etch-thickness of the first polysilicon patterns 105 increases in proportion to a thickness of a metal silicide layer to be formed later.

Referring to FIG. 2C, spacers 111 are formed on the sidewalls of the insulating layer 107, exposed in each of the recess regions R. The spacers 111 preferably comprise materials that are different from the material of the insulating layer 107 and preferably comprise a nitride layer.

The process of forming the spacers 111 is described in more detail below. The spacers 111 are preferably formed by forming a spacer layer on the exposed surfaces of the insulating layer 107 and the first polysilicon pattern 105 and etching the spacer layer. Here, it is preferred that the thickness of the spacer layer be controlled so that the spacer layer does not fill the recess regions R. The spacer layer is etched until the top surfaces of the insulating layer 107 and the first polysilicon patterns 105 are exposed, with the spacer layer thus remaining on the sidewalls of the insulating layer 107. The thickness of the spacer layer may have various values according to the gap between the gate patterns.

Referring to FIG. 2D, second polysilicon pattern 113 is formed within the respective recess regions R. To this end, a second polysilicon layer is higher than the top surface of the insulating layer 107 so that the recess regions R are filled with the second polysilicon layer. Next, the second polysilicon layer is polished to expose the top surface of the insulating layer 107. The polishing of the second polysilicon layer preferably is performed using a Chemical Mechanical Polishing (CMP) method.

Meanwhile, the second polysilicon layer preferably contains silicon (Si) having a concentration lower than the concentration of silicon in the first polysilicon layer so that a mono silicide layer having a lower resistance can be easily formed in a subsequent a silicidation process. For example, where the concentration of silicon (Si) within the first polysilicon layer is 1E20 atoms/cm$^3$, the concentration of silicon (Si) within the second polysilicon layer preferably ranges from 1E19 atoms/cm$^3$ to 5E19 atoms/cm$^3$. Each of the first polysilicon layer and the second polysilicon layer preferably is formed by using a silicon (Si) gas (for example, SiH$_4$) and a dopant gas (for example, PH$_3$). In a process of depositing the first polysilicon layer and the second polysilicon layer, the concentration of silicon (Si) within each of the first polysilicon layer and the second polysilicon layer can be controlled by controlling the amount of the silicon (Si) gas. In an exemplary embodiment of the disclosure, the amount of the silicon (Si) gas used when forming the second polysilicon layer is smaller than the amount of the silicon (Si) gas used when forming the first polysilicon layer such that the concentration of silicon (Si) is lower in the second polysilicon layer than in the first polysilicon layer.

The second polysilicon pattern 113 within the recess region R preferably is narrower than the first polysilicon pattern 105 because of the spacer 111. Consequently, in such a case the interval between the second polysilicon patterns 113, defining the interval between the top surfaces of the conductive lines, is larger than the interval between the first polysilicon patterns 105.

Figure 2E:
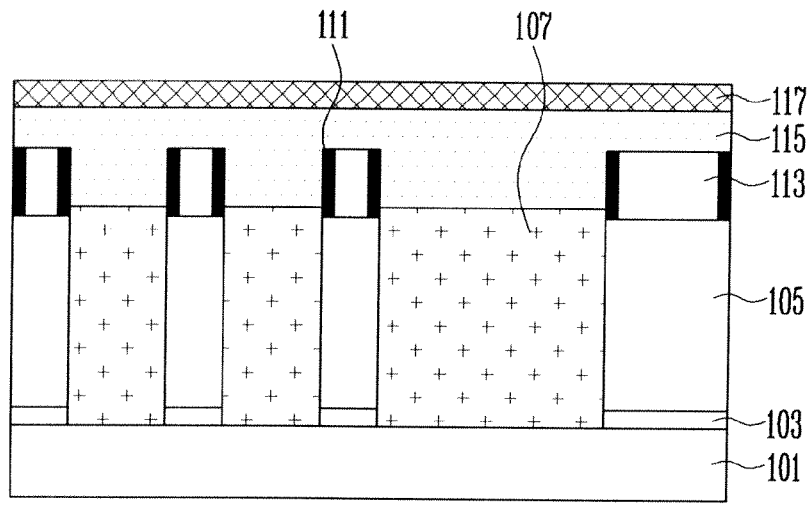

Referring to FIG. 2E, a metal layer 115 is formed on the exposed surfaces of the second polysilicon patterns 113 and the insulating layer 107. The metal layer 115 preferably is deposited using a sputtering method. Further, the metal layer 115 preferably comprises nickel (Ni) which can form a metal silicide layer of a low resistance even though the size of a pattern is reduced because of the high degree of integration. When nickel (Ni) is deposited, the thickness of the metal layer 115 preferably is 0.3 times a total thickness of the polysilicon layer including the thickness of the first polysilicon layer and the thickness of the second polysilicon layer. For example, if the sum of the thickness of the first polysilicon pattern 105 and the thickness of the second polysilicon pattern 113 is 1600 Å, the thickness of the metal layer 115 made of nickel (Ni) preferably is about 500 Å.

Meanwhile, before forming the metal layer 115, the height of top surface of the insulating layer 107 preferably is lowered using an etch process such as an etch-back process, thereby exposing part of the sidewalls of the spacers 111. In this case, the metal layer 115 is also formed between the spacers 111. When the etch-back process is performed on the insulating layer 107, the second polysilicon pattern 113 having a relatively narrow width is supported by the spacers 111. Accordingly, a leaning phenomenon in which the second polysilicon patterns 113 lean during the etch-back process of the insulating layer 107 can be prevented.

After forming the metal layer 115, a Pt (not shown) layer and a capping layer 117 preferably are formed over the metal layer 115, preferably using an in-situ method. The capping layer 117 functions to prevent an oxide layer from being formed on the surface of the metal layer 115, and preferably comprises TiN.

Figure 2F:
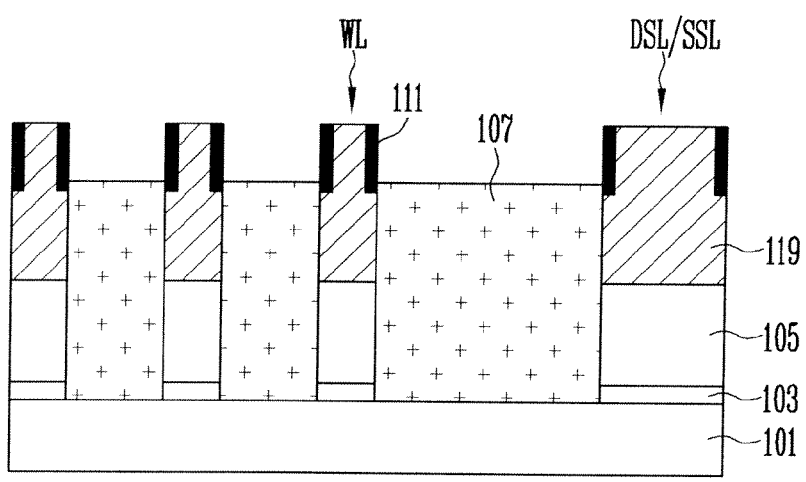

Referring to FIG. 2F, metal silicide patterns 119 are formed using a silicidation process. A method of forming the metal silicide patterns 119 using the silicidation process is described in more detail below.

A primary annealing process is performed to diffuse metal from the metal layer 115 into the second polysilicon patterns 113 through silicidation to form a metal silicide layer having a first resistance. The metal diffused from the metal layer 115 to the second polysilicon patterns 113 can be diffused into regions in which the first polysilicon patterns 105 are formed. Consequently, the top surfaces of the second polysilicon patterns 113 and the first polysilicon patterns 105 react with the metal layer to form the metal silicide layer. Expansion of a volume of the metal silicide layer occurring when the silicidation process is performed is prevented by the spacers 111. Accordingly, in the first exemplary embodiment of the disclosure, a bridge phenomenon between the metal silicide patterns 119 can be prevented.

The thickness of the metal silicide layer can be controlled and the bridge phenomenon can be prevented by controlling a process temperature of the primary annealing process. For example, where nickel (Ni) is used as the metal layer 115, the primary annealing process preferably is performed at a process temperature of 350° C.. Nickel (Ni)-rich silicide is formed by the primary annealing process. Further, in the first exemplary embodiment of the disclosure, since the concentration of silicon (Si) of the second polysilicon patterns 113 is relatively low, the silicidation process can be smoothly performed, and thus the metal silicide layer can be thickly formed as compared with the prior art. Accordingly, in the first exemplary embodiment of the disclosure, resistance of the conductive lines can be improved.

Next, the unreacted metal layer 115 that remains intact and the capping layer 117 are removed. Thus, the metal silicide patterns 119 having a first resistance are self-aligned over the first polysilicon patterns 105, respectively. For example, where nickel (Ni) is used as the metal layer 115, nickel (Ni)-rich silicide patterns having the first resistance can be self-aligned over the first polysilicon patterns 105, respectively.

Next, a secondary annealing process is performed to change the metal silicide patterns of the first resistance into the metal silicide patterns 119 having a second resistance lower than the first resistance. For example, where the metal layer 115 comprises nickel (Ni), the nickel (Ni)-rich silicide patterns can be changed into Ni mono-silicide patterns by performing the secondary annealing process at a process temperature of 500° C.

As a result of the secondary annealing process, the metal silicide patterns 119 (i.e., targets) are formed as described above. Accordingly, word lines WL, a drain select line DSL, and a source select line SSL comprising stack structures of the first polysilicon patterns 105 and the metal silicide patterns 119 can be formed. In particular, where the metal silicide patterns 119 are the Ni mono-silicide patterns, the conductive lines each having a lower resistance than a resistance of a cobalt silicide can be formed.

As described above, in the first exemplary embodiment of the disclosure, the second polysilicon pattern becomes narrower than the first polysilicon pattern by the spacers, and thus the interval between the top surfaces of the conductive lines can be widened. Accordingly, the bridge phenomenon in which the conductive lines are interconnected can be prevented. Furthermore, in the first exemplary embodiment of the disclosure, where the etch-back process is performed on the insulating layer, the spacers can support the second polysilicon patterns during the etch-back process. Accordingly, a leaning phenomenon in which the second polysilicon patterns lean under the influence of the etch-back process can be improved.

Figure 2G:
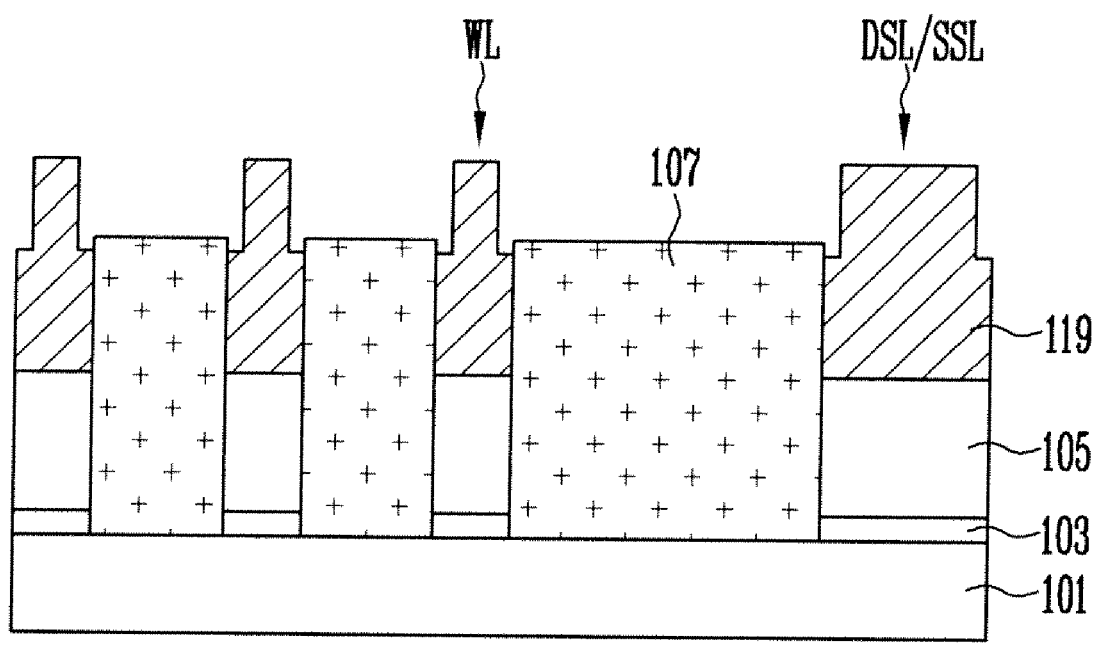

After forming the metal silicide patterns 119, the spacers 111 are removed as shown in FIG. 2G, or subsequent processes of forming an interlayer dielectric layer, etc. can be performed as desired with the spacers 111 remaining intact.

FIGS. 3A to 3D are cross-sectional views illustrating a method of forming conductive lines of a semiconductor memory device according to a second exemplary embodiment of the disclosure. In particular, FIGS. 3A to 3D are cross sections taken along the isolation structure of a NAND flash memory device.

Figure 3A:
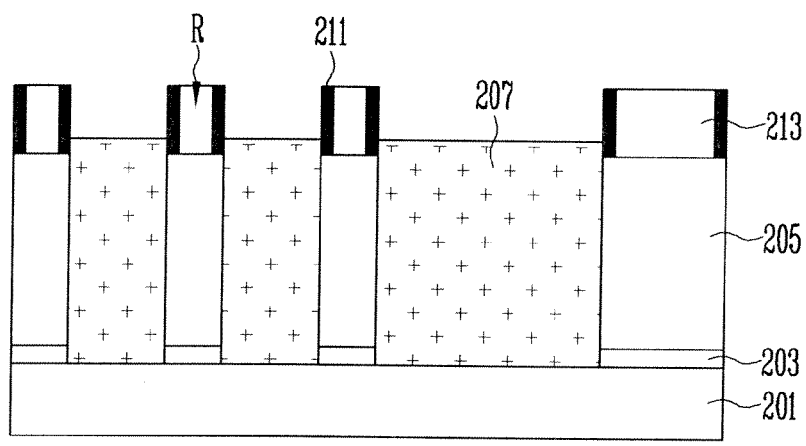
FIGS. 3A to 3D are cross-sectional views illustrating a method of forming the conductive lines of a semiconductor memory device according to a second exemplary embodiment of the disclosure.

Referring to FIG. 3A, a plurality of first polysilicon patterns 205, insulated from each other with an insulating layer 207 interposed therebetween, is formed over an underlying layer 201. The underlying layer 201 illustratively is an isolation layer of a NAND flash memory device, and the first polysilicon patterns 205 illustratively are patterns used as the word lines, the drain select line, and the source select line of the NAND flash memory device.

For example, where the first polysilicon patterns 205 are used as the word lines, the drain select line, and the source select line, the first polysilicon patterns 205 illustratively are formed using the following method. First, a gate insulating layer 203 used as a dielectric layer is formed over the underlying layer 201 (i.e., the isolation layer), and a first polysilicon layer is formed over the gate insulating layer 203. The first polysilicon layer is patterned to form the plurality of separated first polysilicon patterns 205. The gate insulating layer 203 preferably is patterned after the first polysilicon patterns 205 are formed.

Although not shown, before the gate insulating layer 203 used as the dielectric layer is formed, a gate insulating layer, used as a tunnel insulating layer, and a floating gate preferably are stacked over the active region of a semiconductor substrate separated by the underlying layer 201 (i.e., the isolation layer), as described above with reference to FIG. 2A.

After forming the first polysilicon patterns 205, an insulating layer 207 for insulating between the first polysilicon patterns 205 preferably is formed to be higher than a top surface of the first polysilicon patterns 205. Accordingly, the space between the first polysilicon patterns 205 is filled with the insulating layer 207. Next, the insulating layer 207 is polished to expose the top surface of the polysilicon patterns 205. The polishing of the insulating layer 207 preferably is performed using a Chemical Mechanical Polishing (CMP) method, and an oxide layer preferably is used as the insulating layer 207.

Next, as described above with reference to FIG. 2B, the exposed top portion of the first polysilicon patterns 205 is etched using an etch process, such as an etch-back process, so that a top surface of the first polysilicon pattern 205 is lower than a top surface of the insulating layer 207. Thus, a recess region R is formed, and part of sidewalls of the insulating layer 207 is exposed.

Next, as described above with reference to FIG. 2C, spacers 211 are formed on the sidewalls of the recess regions R. As described above with reference to FIG. 2D, second polysilicon patterns 213 to fill the respective recess regions R are formed. Here, the second polysilicon pattern 213 is narrower than the first polysilicon pattern 205 due to the spacers 211. Accordingly, the interval between the second polysilicon patterns 213, defining the interval between the top surfaces of the conductive lines, is larger than the interval between the first polysilicon patterns 205.

Next, a top surface of the insulating layer 207 is lowered using an etch process, such as an etch-back process, to expose the spacers 211. Here, since the spacers 211 support the second polysilicon patterns 213, a leaning phenomenon in which the second polysilicon patterns 213 lean under the influence of the etch-back process for the insulating layer 207 can be improved (i.e., reduced or eliminated).

Figure 3B:
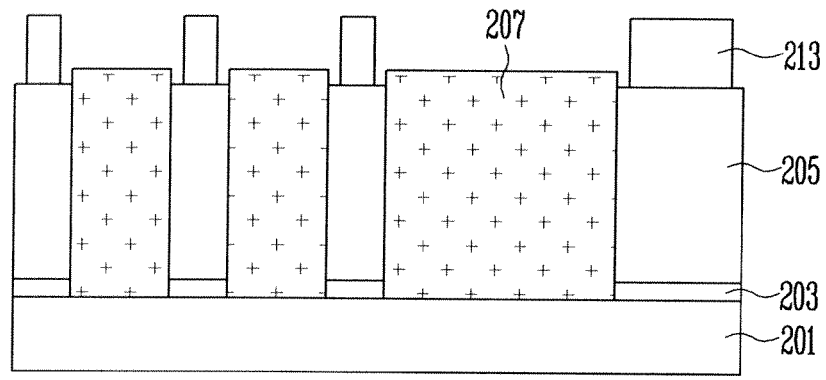

Referring to FIG. 3B, the exposed spacers 211 are removed. Thus, part of the second polysilicon patterns 213 and part of the top surface of the first polysilicon patterns 205 are exposed.

Figure 3C:
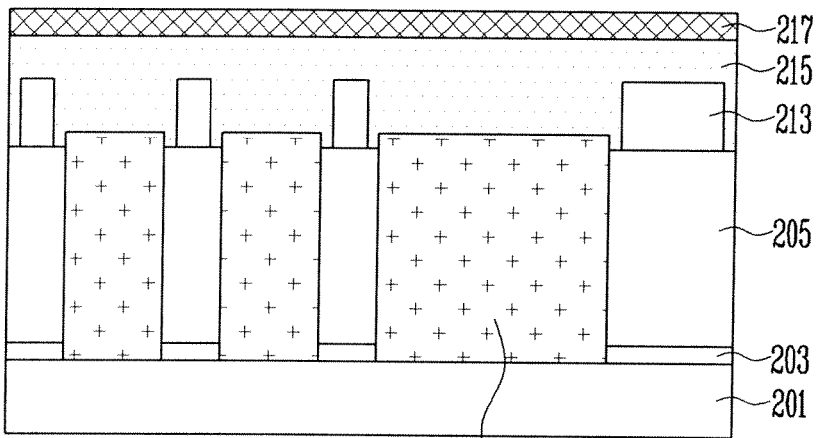

Referring to FIG. 3C, a metal layer 215 is formed on the exposed surfaces of the second polysilicon patterns 213, the first polysilicon patterns 205, and the insulating layer 207. The metal layer 215 preferably is deposited using a sputtering method. Further, the metal layer 215 preferably comprises nickel (Ni), which can form a metal silicide layer of a low resistance although the size of a pattern is reduced because of the high degree of integration. When nickel (Ni) is deposited, the thickness of the metal layer 215 preferably is 0.3 times a total thickness of the polysilicon layer in which the thickness of the first polysilicon layer and the thickness of the second polysilicon layer are added.

Meanwhile, in the second exemplary embodiment of the disclosure, the metal layer 215 can bring into contact with not only the top surface of the second polysilicon patterns 213, but also the sidewalls of the second polysilicon patterns 213 and the exposed surface of the first polysilicon patterns 205. Accordingly, in a subsequent silicidation process, the metal silicide layer can be formed in a wider region.

After forming the metal layer 215, a capping layer 217 preferably is formed over the metal layer 215 using an in-situ method, as described above with reference to FIG. 2F.

Figure 3D:
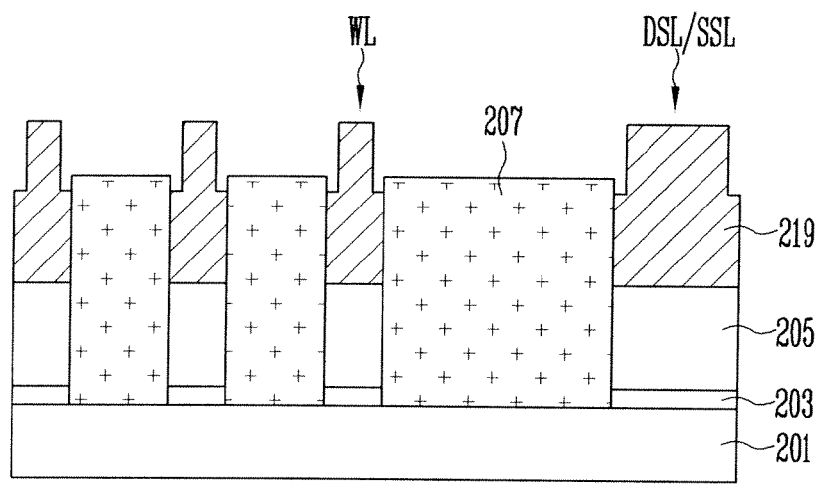

Referring to FIG. 3D, metal silicide patterns 219 are respectively formed over the first polysilicon patterns 205. A method of forming the metal silicide patterns 219 preferably is the same as the method described above with reference to FIG. 2F.

In the second exemplary embodiment of the disclosure, the second polysilicon pattern becomes narrower than the first polysilicon pattern due to the spacers. Thus, since the interval between the top surfaces of the conductive lines can be widened, a bridge phenomenon in which the conductive lines are interconnected can be prevented. Furthermore, in the second exemplary embodiment of the disclosure, where an etch-back process is performed on the insulating layer, the spacers can support the second polysilicon patterns during the etch-back process. Accordingly, a leaning phenomenon in which the second polysilicon patterns lean under the influence of the etch-back process can be improved.

As described above, in accordance with the disclosure, the width of a top surface of the polysilicon pattern, determining the width of a top surface of the conductive line, is reduced using the spacers. Accordingly, a bridge phenomenon in which the conductive lines are interconnected can be reduced or eliminated because an interval between the top surfaces of the conductive lines can be secured.

Furthermore, the polysilicon patterns are supported by the spacers during an etch-back process for the insulating layer. Accordingly, a phenomenon in which the polysilicon patterns lean under the influence of the etch-back process can be prevented, and thus a leaning phenomenon in which the conductive lines finally formed lean can be improved.

Consequently, since the conductive lines can be stably formed, the yield of semiconductor memory devices and the reliability of a manufacturing process can be improved.

What is claimed is:

1. A method of forming conductive lines of a semiconductor memory device, the method comprising:
    forming a first polysilicon layer over an underlying layer;
    forming first polysilicon patterns by patterning the first polysilicon layer;
    filling a space between the first polysilicon patterns with an insulating layer;
    etching a top portion of the first polysilicon patterns to form recess regions;
    forming spacers on sidewalls of the recess regions;
    filling the recess regions with a second polysilicon layer to form second polysilicon patterns; and
    performing a silicidation process to convert the second polysilicon patterns to metal silicide patterns.

2. The method of claim 1, wherein the spacers comprise materials that are different from materials of the insulating layer.

3. The method of claim 1, wherein the spacers comprise a nitride layer.

4. The method of claim 1, wherein the insulating layer comprises an oxide layer.

5. The method of claim 1, wherein a silicon concentration of the second polysilicon layer is lower than a silicon concentration of the first polysilicon layer.

6. The method of claim 1, comprising forming each of the second polysilicon layer and the first polysilicon layer using a silicon (Si) gas and a dopant gas.

7. The method of claim 6, comprising using a smaller amount of silicon (Si) gas when forming the second polysilicon layer than is used when forming the first polysilicon layer.

8. The method of claim 1, wherein the silicidation process comprises:
   forming a metal layer on exposed surfaces of the second polysilicon layer, the spacers, and the insulating layer;
   performing a primary annealing process to diffuse metal from the metal layer into the second polysilicon layer to form a metal silicide layer having a first resistance;
   removing unreacted metal layer remaining intact after the primary annealing process; and
   performing a secondary annealing process to transform the metal silicide layer having the first resistance into a metal silicide layer having a second resistance.

9. The method of claim 8, further comprising forming a capping layer over the metal layer to prevent the metal layer from being oxidized, before performing the primary annealing process.

10. The method of claim 9, wherein the capping layer comprises TiN.

11. The method of claim 8, wherein the metal silicide layer having the first resistance comprises nickel rich silicide and the metal silicide layer having the second resistance comprises nickel mono silicide.

12. The method of claim 8, wherein a process temperature of the secondary annealing process is higher than a process temperature of the primary annealing process.

13. The method of claim 8, wherein the metal layer is a nickel layer having a thickness of 0.3 times a total thickness of the first polysilicon layer and the second polysilicon layer.

14. The method of claim 8, wherein the metal silicide layer having the second resistance comprises word lines, a source select line, and a drain select line of a NAND flash memory device.

15. The method of claim 1, comprising removing the spacers after filling the recess regions with the second polysilicon layer or after performing the silicidation process.

* * * * *